(12) United States Patent
Ho

(10) Patent No.: US 6,276,184 B1
(45) Date of Patent: Aug. 21, 2001

(54) PROCESS AND APPARATUS FOR MANUFACTURING SEMICONDUCTOR DEVICES

(75) Inventor: Chuan R. Ho, Kaohsiung (TW)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/351,472

(22) Filed: Jul. 13, 1999

(30) Foreign Application Priority Data

Jul. 13, 1998 (EP) .................................................. 98202351

(51) Int. Cl.[7] .................................................. B21D 28/20
(52) U.S. Cl. ............................. 72/325; 72/450; 29/566.3; 74/45
(58) Field of Search ............................. 72/450, 451, 325; 100/286, 283, 282; 83/615; 74/45, 38, 25, 43, 40; 29/566.3

(56) References Cited

U.S. PATENT DOCUMENTS

| | | | |
|---|---|---|---|
| 629,392 | * 7/1899 | Protheroe | 74/46 |
| 1,363,021 | * 12/1920 | Slee | 74/46 |
| 4,318,325 | * 3/1982 | Bareis | 83/530 |
| 4,335,497 | * 6/1982 | Casey | 29/566.2 |
| 4,419,929 | * 12/1983 | Dommer | 100/286 |
| 5,493,768 | 2/1996 | Fierkens | 29/566.3 |

FOREIGN PATENT DOCUMENTS

2045154 * 10/1980 (GB) ........................................ 72/450

* cited by examiner

Primary Examiner—Daniel C. Crane

(57) ABSTRACT

A process for manufacturing semiconductor devices is carried out using an apparatus comprising a conversion mechanism having a drive shaft (11), a first rod (12) connected to the drive shaft (11), and a second rod (13) connecting the second rod (12) to a third rod (14) which is guided by means of a linear bearing (16, 17). The mechanism has a lever (21) extending substantially in a transverse direction (x) perpendicular to a stamping direction (z). The third rod (14) is coupled to the lever (21) via a first coupling, in this case a fourth rod (33) which is coupled at a first end to the third rod (14) via a rotary coupling (31) and is coupled to the lever (21) via a rotary coupling (32). The lever (21) is further coupled to the chassis (50) via a second coupling (40) and is coupled to a plunger (71) via a third coupling (60). The second coupling (40) is formed in this case by a fifth rod (43) that is coupled at a first end to the chassis (50) via a rotary coupling (41) and is coupled to the lever (21) via a rotary coupling (42). The fourth rod (33) and the fifth rod (43) are equal in length. As a result there is no substantial resultant force on the lever (21) in the transverse direction (x). A stamping tool (74) is mounted on the plunger (71) for stamping semiconductor devices (80) in a stamping process according to the invention. The semiconductor devices (80) consist of a carrier (81) on which a die (82) is mounted. During the stamping process, the shaft (11) is rotated and the plunger (71) with the stamping tool (74) are moved in the stamping direction (z) in a reciprocating manner. When the stamping tool (74) is lifted, a strip (85) comprising semiconductor devices is moved such that a semiconductor device (80) is positioned under the stamping tool (74). Subsequently the stamping tool (74) is lowered whereby the leads (86) are cut loose from the strip (85) and are bent into an appropriate shape.

9 Claims, 3 Drawing Sheets

PROCESS AND APPARATUS FOR MANUFACTURING SEMICONDUCTOR DEVICES

BACKGROUND OF THE INVENTION

The invention relates to a process for manufacturing semiconductor devices comprising a die on a carrier, the process comprising the steps of
providing the carrier,
stamping the carrier with a stamping tool by driving the stamping tool in a reciprocating manner in a stamping direction by means of a conversion mechanism which converts a rotary movement to a reciprocating movement.

The invention further relates to an apparatus for manufacturing semiconductor devices comprising a die on a carrier, the apparatus comprising
a chassis,
a plunger for carrying a stamping tool, which plunger is guided relative to the chassis in a stamping direction by a plunger bearing,
a conversion mechanism for driving the plunger in a reciprocating manner in the stamping direction, the conversion mechanism being conceived to convert a rotary movement to a reciprocating movement. Here the word 'stamping' is meant to include processes such as IC damber cutting, trim forming and BGA singulation by means of punching.

Such a process and such an apparatus are known from U.S. Pat. No. 5,493,768. The known apparatus comprises a motor driven disc and a rod that is eccentrically connected with one end to the disc. The other end of the rod is connected to a first end of a horizontal lever. The horizontal lever is rotatably connected to a chassis and is connected at a second end to a plunger via a plunger rod. When the disc is rotated the lever is tilted via the rod and the plunger is reciprocally driven in the horizontal direction. A stamping tool can be connected to the plunger in order to trim excess portions from leads of a leadframe strip package having a semiconductor chip mounted thereon. It has been found that stamping with the known apparatus does not always result in semiconductor devices that meet the dimensional tolerance requirement of the leads such as coplanarity.

SUMMARY OF THE INVENTION

It is an object of the invention to improve the coplanarity of semiconductor devices. It is another object of the invention to increase the lifetime of the stamping tool.

The process according to the invention is characterised in that during stamping of the carrier substantially no force is exerted by the conversion mechanism on the stamping tool in directions perpendicular to the stamping direction. The invention is based on the insight that the conversion mechanism which is used in the known process results in a resultant force component on the stamping tool in a direction perpendicular to the stamping direction and that the direction of this resultant force component changes when the direction of the movement of the stamping tool changes. This changing resultant force component in a direction perpendicular to the stamping direction causes the stamping tool to make a tilting movement superpositioned on the movement in the stamping direction. Due to this tilting the co-planarity of the semiconductor device is affected. Due to the measure according to the invention, the stamping tool does not tilt during stamping of the carrier so that the co-planarity of semiconductor devices manufactured with this process is improved in comparison with the known process.

Mounting the die on the carrier before stamping the carrier has the advantage that the carrier can be handled more easily during mounting of the die because it can be part of a strip or an array of carriers. It can be provided with positioning elements and the carrier can be separated from the strip, array and/or positioning elements by means of stamping after mounting of the die.

Encapsulating the die before stamping the carrier has the advantage that the carrier can be dimensioned and/or trimmed as a last step in the production process so that the dimensional tolerances of the carrier can be minimised.

Biasing the stamping tool in a direction parallel to the stamping direction has the advantage that any play in the mechanism for moving the stamping tool is neutralised so that this play does not affect the dimensional tolerances of the carrier.

The apparatus according to the invention is characterised in that the conversion mechanism is conceived to exert substantially no force on the plunger in directions perpendicular to the stamping direction. Due to this measure the advantages of the process according to the invention are obtained. Another advantage of this measure is that the plunger bearing does not have to absorb large tilt forces. As a result, the wear of the plunger bearing is reduced and the stamping tool remains accurately positioned even after a large number of strokes so that a more constant quality of the semiconductor devices is obtained.

A lever can very suitably be used in a conversion mechanism for converting a rotational movement to a reciprocating movement because it can amplify a force. That has have the advantage that there is substantially no resultant force on the lever in a direction perpendicular to the stamping direction during stamping. As a result, the lever will not exert any force on the plunger and the stamping tool in a direction perpendicular to the stamping direction.

An advantage is that a slide coupling reduces the forces in the slide direction to the residual friction forces in the slide coupling so that almost no forces in the transversal direction are exerted on the lever.

An advantage is that there is virtually no resultant force on the lever in a direction perpendicular to the stamping direction, while the use of expensive slide couplings is avoided. The first coupling exerts a first force in the transverse direction and the second coupling exerts a second force in the transverse direction, which first force and second force are of substantially equal magnitude and opposite in direction so that the forces in the transverse direction on the lever are balanced.

An advantage is that any residual transverse force on the lever is absorbed by the lever bearing and is not transferred to the stamping tool.

An advantage is that the play in the couplings is neutralised so that this play does not affect the position of the stamping tool.

BRIEF DESCRIPTION OF THE DRAWINGS

These and other aspects of the invention will be apparent from and elucidated with reference to the embodiments described hereafter.

In the drawings.

DETAILED DESCRIPTION OF THE PREFERRED EMBODIMENTS

Figure 1:
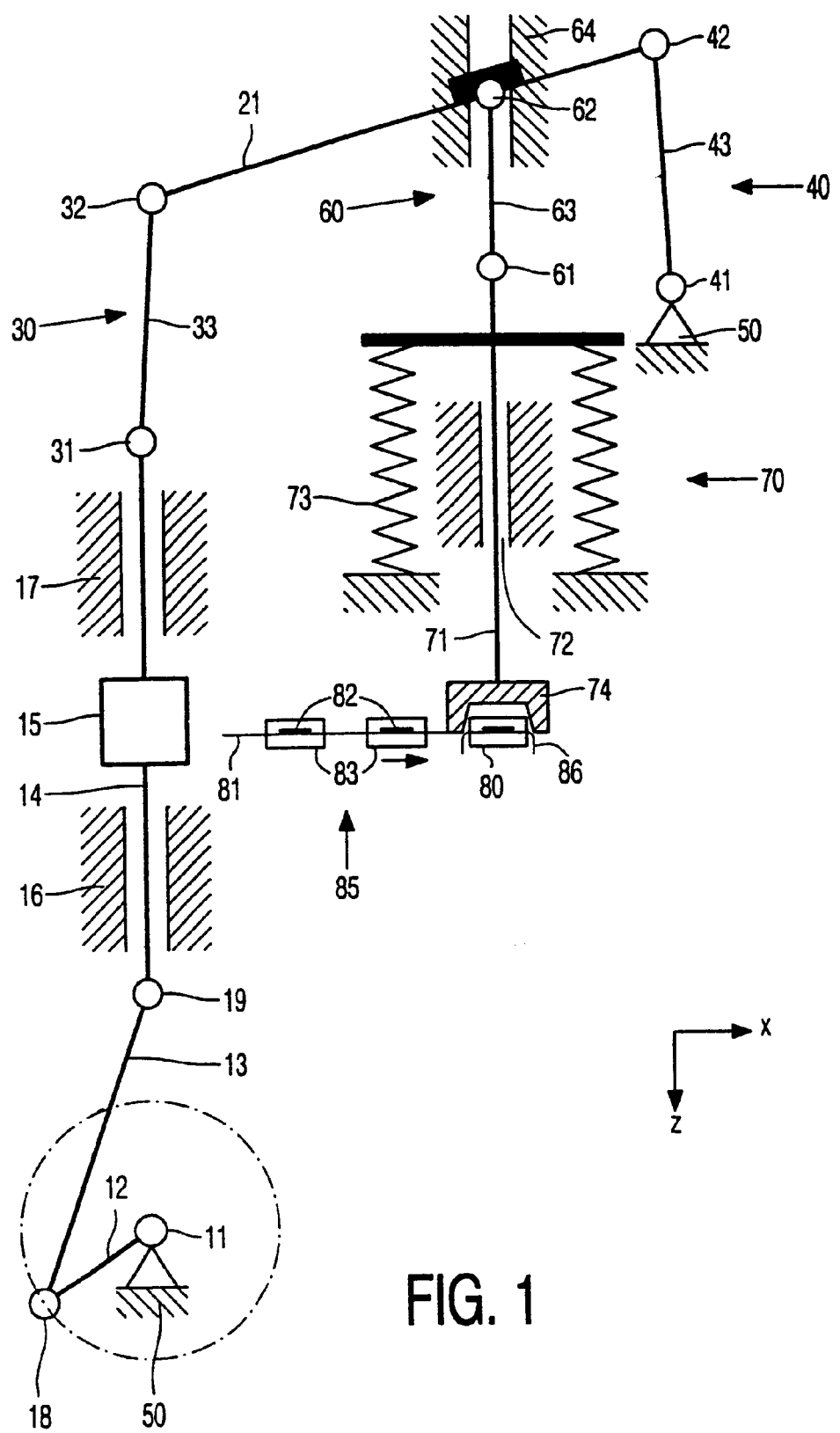
FIG. 1 shows a diagrammatic representation of a first embodiment of the apparatus according to the invention.

FIG. 1 shows a diagrammatic representation of a first embodiment of the apparatus according to the invention. The apparatus comprises a conversion mechanism having a drive shaft 11 which is rotatably mounted on a chassis 50 and which can be driven by a motor (not shown). The mechanism further comprises a first rod 12 connected to the drive shaft 11, and a second rod 13 connecting the second rod 12 to a third rod 14 which is guided by means of a linear bearing 16, 17. A force limiter 15 has been mounted in the third rod 14 to protect the apparatus against overload. The mechanism comprises a lever 21 extending substantially in a transverse direction x perpendicular to a stamping direction z. The third rod 14 is coupled to the lever 21 via a first coupling, in this case a rod 33 which is coupled at a first end to the third rod 14 via a rotary coupling 31 and is coupled to the lever 21 via a rotary coupling 32. The lever 21 is further coupled to the chassis 50 via a second coupling 40 and is coupled to a plunger 71 via a third coupling 60. The second coupling 40 is formed in this case by a rod 43 which at a first end is coupled to the chassis 50 via a rotary coupling 41 and is coupled to the lever 21 via a rotary coupling 42. The rod 33 and the rod 43 are equal in length so that the distance between the couplings 31 and 32 is equal to the distance between the couplings 41 and 42. Due to the measures according to the invention there is no substantial resultant force on the lever 21 in the transverse direction x as will be explained with reference to FIG. 2. In order to absorb any residual resultant force in the transverse direction x, the lever 21 is guided in the stamping direction z by means of a lever bearing 64 and the third coupling is a rod 63 which at a first end is coupled to the plunger 71 via a rotary coupling 61 and is coupled to the lever 21 via a rotary coupling 62. The plunger 71 is guided in the stamping direction z by means of a bearing 72 and the plunger 71 is biased in a direction opposite to the stamping direction z in order to push out all play in the couplings 18, 19, 31, 32, 41, 42, 61 and 62. A stamping tool 74 is mounted on the plunger 71 for stamping semiconductor devices 80 in a stamping process according to the invention. The semiconductor devices 80 comprise a carrier 81 on which a die 82 is mounted. The die 82 is further encapsulated in a resin 83 to protect the die 82. During the stamping process, the shaft 11 is rotated and the plunger 71 and the stamping tool 74 are moved in the stamping direction z in a reciprocating manner. When the stamping tool 74 is lifted, a strip 85 comprising semiconductor devices is moved such that a semiconductor device 80 is positioned under the stamping tool 74. Subsequently the stamping tool 74 is lowered whereby the leads 86 are cut loose from the strip 85 and are bent into an appropriate shape.

Figure 2:
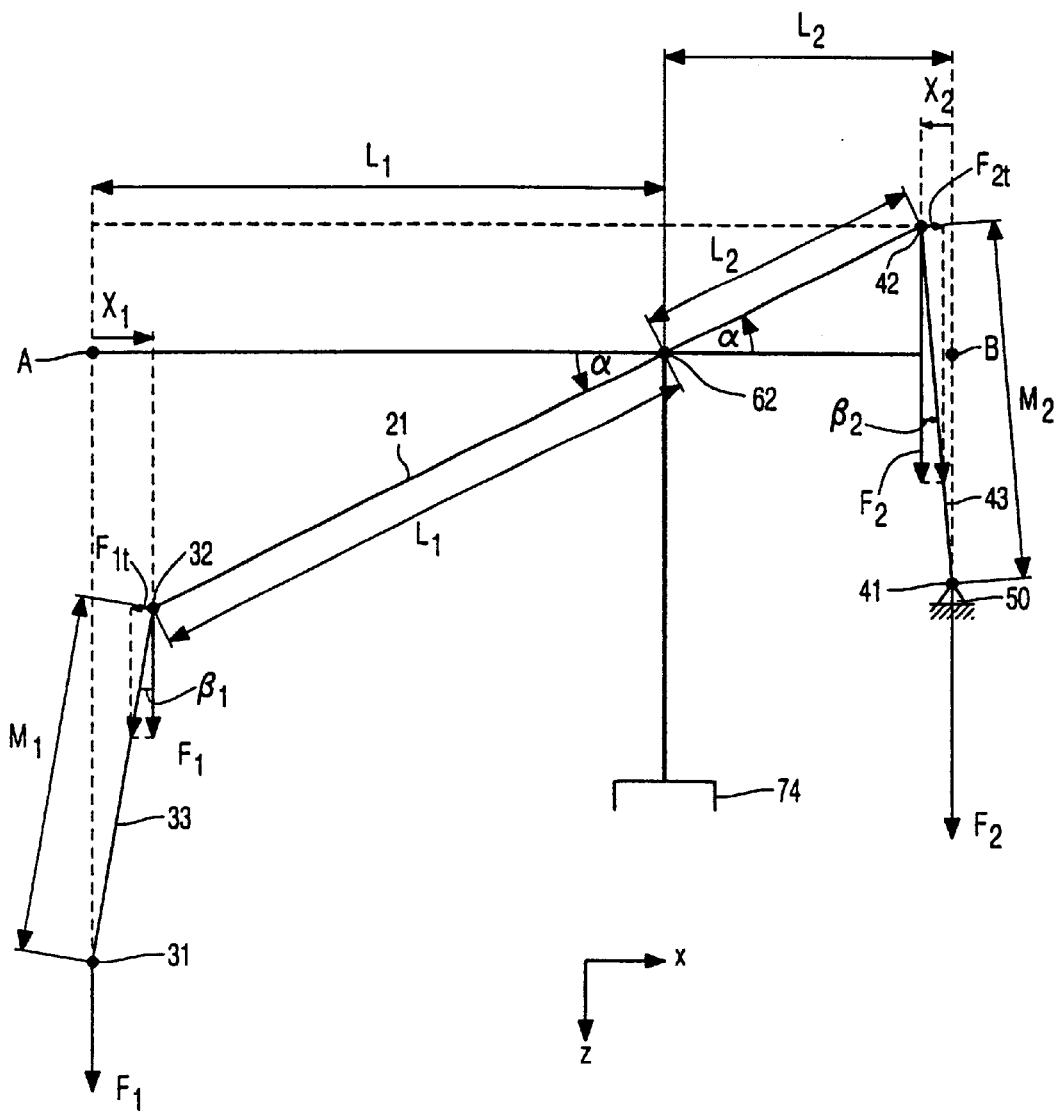
FIG. 2 shows a diagrammatic representation of the forces exerted in the course of the process according to the invention and FIG. 3 shows a second embodiment of the apparatus according to the invention.

FIG. 2 shows a diagrammatic representation of the forces exerted in the apparatus shown in FIG. 1 when process according to the invention is carried out. The reference numerals used in FIG. 2 denote the same elements as described with reference to FIG. 1. In accordance with the process according the invention, a force F1 is exerted on coupling 31 in the stamping direction z to move the stamping tool 74 downwards. The lever 21 is connected to the stamping tool 74 via the freely rotatable coupling 62 and is connected to the chassis 50 via the rod 43. The distance between coupling 32 and coupling 62 is equal to L1 and the distance between coupling 42 and coupling 62 is equal to L2. The coupling 31 is in the transverse direction x positioned under point A at a distance L1 from the coupling 62. The coupling 41 is in the transverse direction x positioned under point B at a distance L2 from the coupling 62. Hence, the force F1 will result in a force F2 on the coupling 41, which force F2 has a magnitude $$F2=F1*L1/L2 \quad (1)$$

When the lever 21 is tilted through an angle $\alpha$ and the coupling 31 is positioned at distance L1 in the transverse direction x from coupling 62, the rod 33 will make an angle $\beta 1$ with the stamping direction z which can be found to be:

$$\sin(\beta 1)=X1/M1 \quad (2)$$

wherein $$X1=L1(1-\cos(\alpha)) \quad (3)$$

as can be derived from FIG. 2 and M1 is the distance between the couplings 31 and 32.

Similarly, when the coupling 41 is positioned at a distance L2 in the transverse direction x from coupling 62, rod 43 will make an angle $\beta 2$ with the stamping direction z which can be found to be:

$$\sin(\beta 2)=X2/M2 \quad (4)$$

wherein $$X2=L2(1-\cos(\alpha)) \quad (5)$$

as can be derived from FIG. 2 and M2 is the distance between the couplings 41 and 42.

Because of the angle $\beta 1$, the force F1 will result in a transverse force F1$t$ on lever 21, which force F2 has a magnitude $$F1t=F1.\tan(\beta 1). \quad (6)$$

Because of the angle $\beta 2$, the force F2 will result in a transverse force F2$t$ on lever 21 which is opposite to F1$t$ and which has a magnitude $$F2t=F2.\tan(\beta 2) \quad (7).$$

From equations (1) to (7) it can be derived that $$F1t/F2t=M1/M2.\cos(\beta 2)/\cos(\beta 1) \quad (8)$$

When $\beta 1$ and $\beta 2$ are small, $\cos(\beta 1)\cong 1$ and $\cos(\beta 2)\cong 1$ so that F1$t$ and F2$t$ are of substantially equal magnitude and the resultant transverse force on lever 21 is substantially zero when M1=M2.

Figure 3:
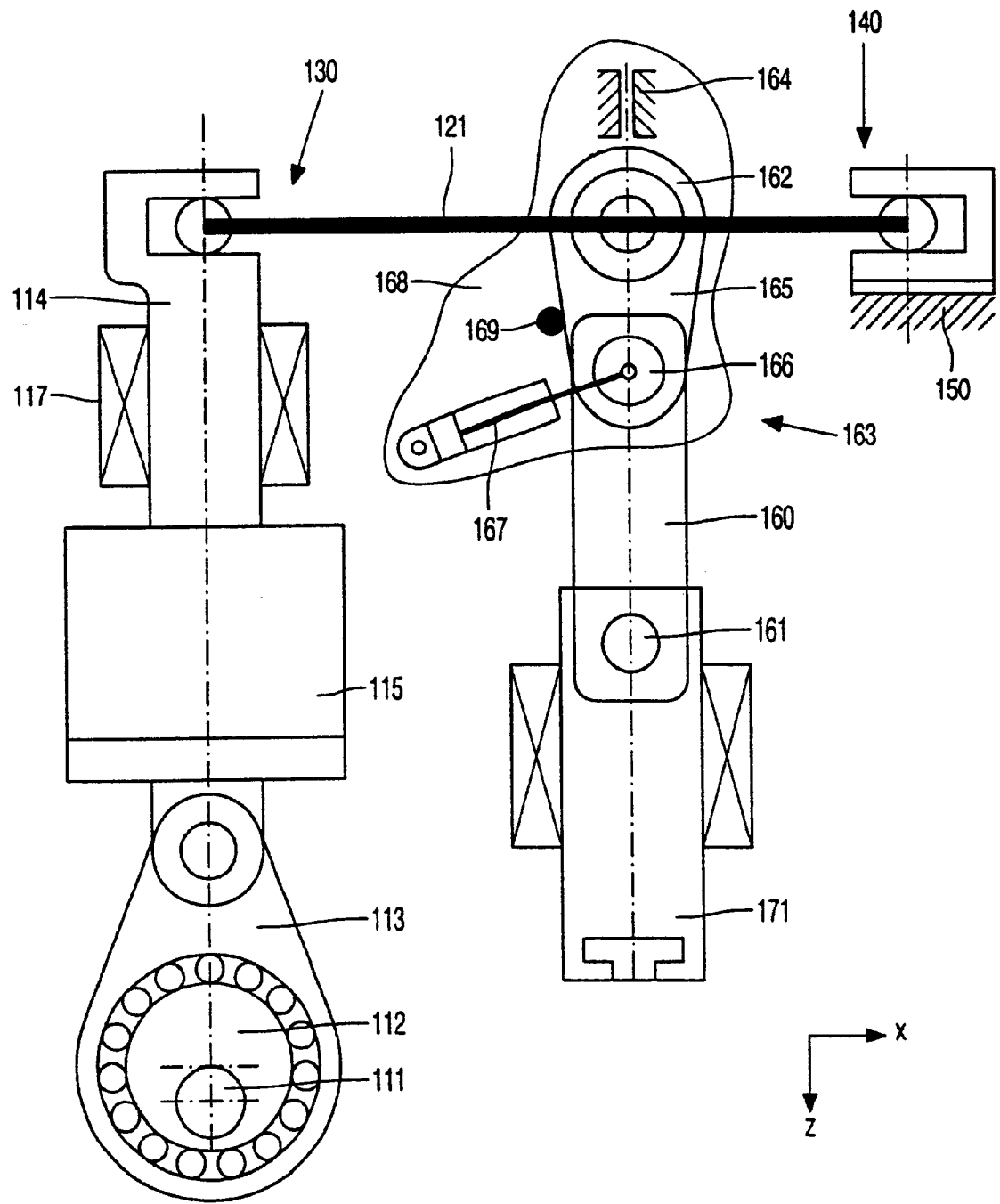

FIG. 3 shows a second embodiment of the apparatus according to the invention. The apparatus comprises a conversion mechanism having a drive shaft 111 that can be driven by a motor (not shown). The mechanism further comprises a disc 112 eccentrically mounted on the drive shaft 111, and a plate 113 connecting the disc 112 to a rod 114 which is guided by means of a linear bearing 117. A force limiter 115 has been mounted in the rod 114 to protect the apparatus against overload. The mechanism comprises a lever 121 extending substantially in a transverse direction x perpendicular to a stamping direction z. The rod 114 is coupled to the lever 121 via a slide coupling 130 that allows the lever 121 to slide relative to the rod 114 in the transverse direction x. The lever 121 is further coupled to a chassis 150 via a further slide coupling 140 which allows the lever 121 to slide relative to the chassis 150 in the transverse direction x. The lever 121 is coupled to a plunger 171 via a third coupling. Each of the slide couplings 130 and 140 will only exert a small friction force on the lever 121 in the transverse direction x. As these friction forces are of opposite direction there will be no substantial resultant force on the lever 121. The third coupling is formed by an assembly 163 which at a first end is coupled to the plunger 171 via a rotary coupling 161 and is coupled to the lever 121 via a rotary coupling 162. The assembly 163 comprises a rod 160 that is coupled to a rod 165 via a rotary coupling 166. The rod 165 is rotatably mounted around coupling 162 on a plate 168 but, during operation, is firmly held against a stop 169 by means of an actuator 167 so that the coupling 166 is fixed relative to the plate 168. The plate 168 is guided in the stamping direction z by means of a lever bearing 164. For maintenance, the actuator 167 can be operated so as to cause the rod 165 to rotate away from the stop 169 so that the plunger 171 is lifted and a stamping tool can be easily mounted on the plunger 171.

It is to be noted that the invention is not limited to the embodiments described above. The carrier may, for example, also be an isolating substrate provided with a printed interconnection pattern. Further, the levers 21 and 121 may be directly coupled to the plunger or the stamping tool by means of a rotary coupling and the force limiters 15 and 115 may be omitted if desired.

What is claimed is:

1. A process for manufacturing semiconductor devices comprising a die on a carrier, the process comprising the steps of providing the carrier, stamping the carrier with a stamping tool by driving the stamping tool in a reciprocating movement in a stamping direction by means of a conversion mechanism, including a circularly movable portion, which converts a rotary movement of the circularly movable portion to the reciprocating movement of the stamping tool, characterised in that during stamping of the carrier substantially no force is exerted by the conversion mechanism on the stamping tool in directions perpendicular to the stamping direction, and the die is mounted on the carrier before stamping the carrier.

2. A process as claimed in claim 1, characterised in that the die is encapsulated before stamping the carrier.

3. A process as claimed in claim 1, characterised in that the stamping tool is biased in a direction parallel to the stamping direction.

4. An apparatus for manufacturing semiconductor devices comprising a die on a carrier, the apparatus comprising a chassis, a plunger for carrying a stamping tool, which plunger is guided relative to the chassis in a stamping direction by a plunger bearing, a conversion mechanism, including a circularly movable portion, that drives the plunger in a reciprocating movement in the stamping direction, the conversion mechanism being disposed to convert a rotary movement of the circularly movable portion to the reciprocating movement of the plunger, characterised in that the conversion mechanism is conceived to exert substantially no force on the plunger in directions perpendicular to the stamping direction.

5. An apparatus as claimed in claim 4, characterised in that the conversion mechanism comprises a drive element which is drivable in the stamping direction, the conversion mechanism comprises a lever extending substantially in a transverse direction perpendicular to the stamping direction, the lever is coupled to the drive element via a first coupling, the lever is coupled to the chassis via a second coupling, the lever is coupled to the plunger via a third coupling, and the forces in directions perpendicular to the stamping direction exerted on the lever via the first coupling and the second coupling balance out.

6. An apparatus as claimed in claim 6, characterised in that the first coupling and the second coupling are slide couplings which are slidable in the transverse direction.

7. An apparatus as claimed in claim 5, characterised in that the first coupling is formed by a first link which in a first position is rotatably connected to the driving element and in a second position is rotatably connected to the lever, the second coupling is formed by a second link which in a third position is rotatably connected to the chassis and in a fourth position is rotatably connected to the lever, the distance between the first position and the second position is substantially equal to the distance between the third position and the fourth position, and the third coupling is positioned between the first coupling and the second coupling.

8. An apparatus as claimed in claim 5, characterised in that the third coupling is formed by a third link which in a fifth position is rotatably connected to the plunger and in a sixth position is rotatably connected to the lever, and in that near the sixth position the lever is guided in the stamping direction by means of a lever bearing.

9. An apparatus as claimed in claim 4, characterised in that the apparatus comprises biasing means for biasing the plunger in a direction parallel to the stamping direction.

* * * * *